(12) United States Patent  
Reinmuth et al.

(10) Patent No.: US 9,114,978 B2  
(45) Date of Patent: Aug. 25, 2015

(54) METHOD FOR MANUFACTURING A COMPONENT HAVING AN ELECTRICAL THROUGH-CONNECTION

(71) Applicants: Jochen Reinmuth, Reutlingen (DE); Jens Frey, Filderstadt (DE); Yvonne Bergmann, Reutlingen (DE)

(72) Inventors: Jochen Reinmuth, Reutlingen (DE); Jens Frey, Filderstadt (DE); Yvonne Bergmann, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 13/921,419

(22) Filed: Jun. 19, 2013

(65) Prior Publication Data

US 2013/0341738 A1    Dec. 26, 2013

(30) Foreign Application Priority Data

Jun. 21, 2012  (DE) .................. 10 2012 210 472

(51) Int. Cl.
*H01L 29/84* (2006.01)
*B81C 1/00* (2006.01)
*B81B 3/00* (2006.01)
*B81B 7/00* (2006.01)

(52) U.S. Cl.
CPC ........... *B81C 1/00134* (2013.01); *B81B 3/0018* (2013.01); *B81B 7/007* (2013.01); *B81B 2207/095* (2013.01)

(58) Field of Classification Search
None
See application file for complete search history.

(56) References Cited

U.S. PATENT DOCUMENTS 7,884,015 B2 * 2/2011 Sulfridge ................ 438/667
2009/0032951 A1 * 2/2009 Andry et al. ............. 257/751

* cited by examiner

*Primary Examiner* — Kyoung Lee
(74) *Attorney, Agent, or Firm* — Kenyon & Kenyon LLP

(57) ABSTRACT

A method for manufacturing a component having an electrical through-connection includes: providing a semiconductor substrate having a front side and a back side opposite from the front side; producing, on the front side of the semiconductor substrate, an insulating trench which annularly surrounds a contact area; introducing an insulating material into the insulating trench; producing a contact hole on the front side of the semiconductor substrate by removing the semiconductor material surrounded by the insulating trench in the contact area; and depositing a metallic material in the contact hole.

15 Claims, 8 Drawing Sheets

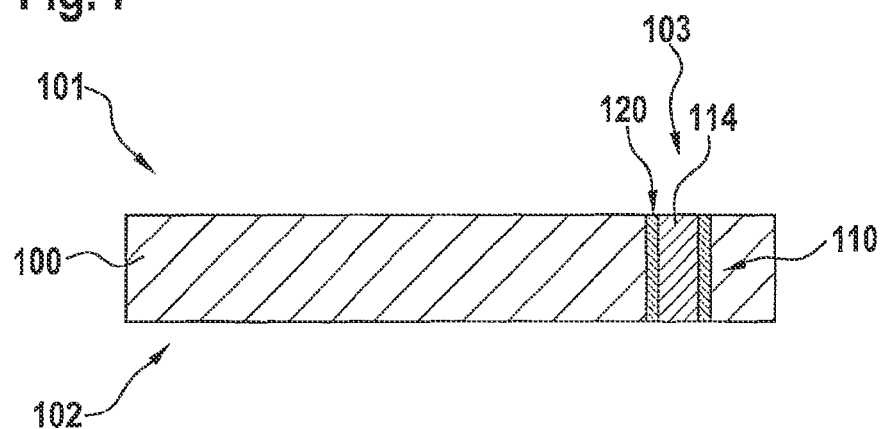
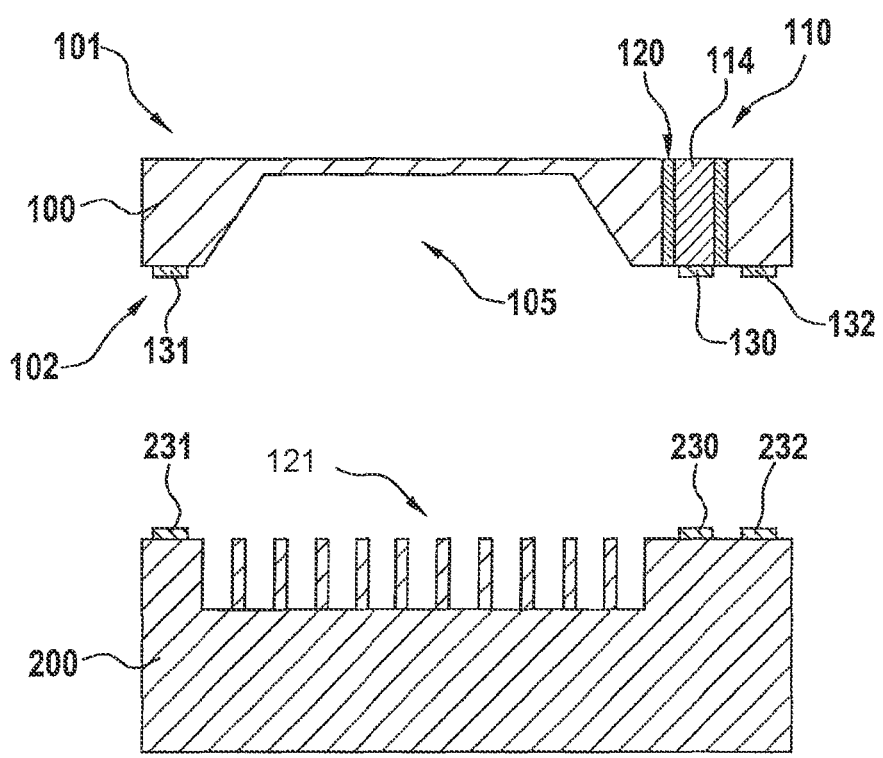

METHOD FOR MANUFACTURING A COMPONENT HAVING AN ELECTRICAL THROUGH-CONNECTION

BACKGROUND OF THE INVENTION

1. Field of the Invention

The present invention relates to a method for manufacturing a component, in particular a microelectromechanical component, having a through-connection.

2. Description of the Related Art

The development of increasingly smaller packets of microelectromechanical components (MEMS, microelectromechanical system) requires, among other things, stacking and through contacting of individual elements such as a sensor, a sensor cap, and an evaluation circuit (ASIC). Arranging the elements one on top of the other is referred to as MEMS 3D integration. The so-called through silicon vias (TSV) are one option for a through-connection in microelectromechanical components built up on silicon substrates. Such TSV structures must meet a number of criteria concerning their electrical resistance and mechanical stability. In the stacking of various microcomponents such as sensors and ASICs, it is particularly important, among other things, to lead the sensor signal from a capped sensor, for example an acceleration sensor or yaw rate sensor, through the sensor cap.

In implementing vertical contacts, the aim is to achieve contact structures having the smallest possible base area, and at the same time having the lowest possible volume resistance.

To achieve this, very narrow holes having practically vertical walls are generally provided in the semiconductor substrate, for example using a customary trench method or a laser. After the subsequent deposition of an insulating layer and opening the insulating layer at the base of the holes, the holes are completely or partially filled with a metal.

Gas deposition processes such as copper chemical vapor deposition (CVD), or electroplating processes such as copper electroplating deposition, among others, are used for metal plating electrical through-connections in substrates. However, these standard processes are not suited for metal plating a through-connection in the cap of an already capped sensor wafer, since the bonding layer may be attacked by the electroplating baths used, and which may flow through the bonding layer. In contrast, copper CVD processes allow only copper wetting of the side wall, but not complete filling of the contact hole. In addition, these processes use polymer or oxide layers as an insulating layer, which due to their small thickness facilitate parasitic capacitances between the through-connection and the surrounding semiconductor material. The strict requirements for an MEMS via are often not met due to these parasitic capacitances.

BRIEF SUMMARY OF THE INVENTION

An object of the present invention, therefore, is to provide a via-middle approach for producing an electrical through-connection which allows the production of the through-connection in a cap wafer independently from the manufacture of an associated microelectromechanical sensor.

In the method according to the present invention for manufacturing a component having a through-connection, a semiconductor substrate having a front side and a back side opposite from the front side is initially provided. An insulating trench which annularly surrounds a contact area is then produced on the front side of the semiconductor substrate. A ring-shaped insulating structure is produced by introducing an insulating material into the insulating trench. In addition, a contact hole is produced on the front side of the semiconductor substrate by removing the semiconductor material surrounded by the insulating area in the contact area. Lastly, a metallic material is deposited in the contact hole. The production of the electrical through-connection takes place completely independently of the production of other elements of the component. Thus, the via process steps do not have to be compatible with the other elements of the component. Therefore, the production of the through-connection may also include high-temperature processes above 400° C. as well as dispensing or electroplating processes, with the aid of which in particular contacts having a small base area and a high aspect ratio may be efficiently produced. A particularly thick insulating layer between the metal filling of the through-connection and the surrounding semiconductor material may be produced by using a ring-shaped insulating trench. In turn, the risk of leakage currents and capacitive disturbances may thus be reduced.

According to one specific embodiment, the insulating trench is designed in the form of a blind hole, and after the metallic material is deposited in the contact hole, the semiconductor substrate is thinned from the back side, thus exposing the insulating material and the metallic material. This method allows greater layer thicknesses of the wafer during processing, thus on the one hand simplifying the handling of the wafer and on the other hand reducing the risk of breakage of the wafer.

In one specific embodiment of the semiconductor wafer, which is filled with metal, in contrast to a known via-middle approach the risk of metal smearing over the oxide insulating surface is reduced.

In another specific embodiment it is provided that the semiconductor material remaining in the contact area is selectively removed with respect to the insulating material in the insulating trench with the aid of an isotropic etching process. A self-adjusting opening of the contact hole is thus achieved. Deep contact holes having high aspect ratios may also be reliably etched.

Another specific embodiment provides that glass, in particular borosilicate glass, which is introduced into the insulating trench with the aid of an embossing process is used as the insulating material. By using glass, and in particular borosilicate glass, as the insulating material, relatively wide insulating trenches may be produced, thus reducing the risk of possible parasitic capacitances and leakage currents in a particularly effective manner. The embossing process is particularly well suited for filling relatively wide trenches. Since glass has a coefficient of thermal expansion comparable to that of silicon, thermally induced mechanical stresses in the substrate may thus be avoided.

In another specific embodiment it is provided that the deposition of the metallic material in the contact hole is carried out together with establishing rewiring on the front side of the semiconductor material. Method steps may thus be saved, also resulting in simplification of the manufacturing process, and thus also a reduction in the manufacturing costs for the component.

In another specific embodiment it is provided that the thinning of the semiconductor substrate is carried out with the aid of a grinding process, a wet or dry etching process, or a combination of these processes. Particularly thick semiconductor layers may be effectively thinned with the aid of the grinding process. In contrast, wet and dry etching processes allow the selective removal of the semiconductor material.

Another specific embodiment provides that an electroplating copper deposition process, a copper CVD process, a metal paste printing process, and/or an inkjet printing process using nanosilver ink is/are used for filling the contact hole with a metallic material. Complete filling of the contact hole may be achieved very reliably with the aid of copper electroplating. In contrast, the copper CVD metal plating process allows the formation of a thin metal layer on the side walls and the base of the contact hole. Metal plating of the contact holes may be carried out relatively quickly with the aid of the metal paste printing process and the inkjet printing process using nanosilver ink.

In another specific embodiment it is provided that after the metallic material is deposited in the contact hole, the semiconductor substrate is connected to a functional substrate within the scope of a bonding process. Since the metal deposition in the contact hole takes place prior to the bonding process, the metal plating process does not have to be compatible with the functional substrate. In particular, for producing the through-connection, high-temperature processes above 400° C. as well as dispensing or electroplating processes may be used, which may result in damage to or sticking together of functional structures of the functional substrate.

In another specific embodiment it is provided that a cavern for accommodating a functional structure situated on the functional substrate is produced before the semiconductor substrate is connected to the functional substrate on the front side of the semiconductor substrate. With the aid of such a cavern, a receiving space for the functional structures is produced which allows a gas-tight enclosure of the functional structures with respect to the outside.

According to the present invention, in addition a component including a semiconductor substrate which has a backside contact that passes through the semiconductor substrate from a front side to a back side opposite from the front side is provided. The through-connection includes an insulating structure composed of an insulating trench which annularly surrounds a contact area and which is filled with an insulating material, an electrical contact structure situated on the back side of the semiconductor substrate in the contact area, and a metallic filling, situated in the contact area, which is delimited by the insulating structure and which electrically connects the electrical contact structure to the front side of the semiconductor substrate. Due to the option of producing the insulating trench with an arbitrary thickness, the through-connection may be adapted to various technical applications. In particular, good electrical insulation of the metallic filling from the surrounding semiconductor substrate may be provided with the aid of a relatively wide insulating trench. At the same time, interfering capacitances are also reduced. Furthermore, the diameter of the metallic filling may have an arbitrary size, so that the volume resistance of the through-connection may be adapted to various applications relatively easily.

Lastly, one specific embodiment provides that the semiconductor substrate has a cavern and is connected to the functional substrate in such a way that a functional structure situated on the surface of the functional substrate is present inside the cavern. The electrical contact structure is electrically connected to a complementary contact structure of the functional structure. In this configuration, the semiconductor substrate is used as a cap for the functional structures of the functional substrate. The through-connection allows an electrical connection of the functional structure enclosed between the two substrates.

BRIEF DESCRIPTION OF THE DRAWINGS

FIG. 7 shows the semiconductor substrate from FIG. 5 after thinning, the semiconductor material having been removed on the back side of the semiconductor substrate until the through-connection is exposed.

FIG. 8 shows the semiconductor substrate from FIG. 7 prior to bonding to a functional substrate, a cavern for accommodating functional structures of the functional substrate having been produced on the back side of the semiconductor substrate.

DETAILED DESCRIPTION OF THE INVENTION

Figure 1:
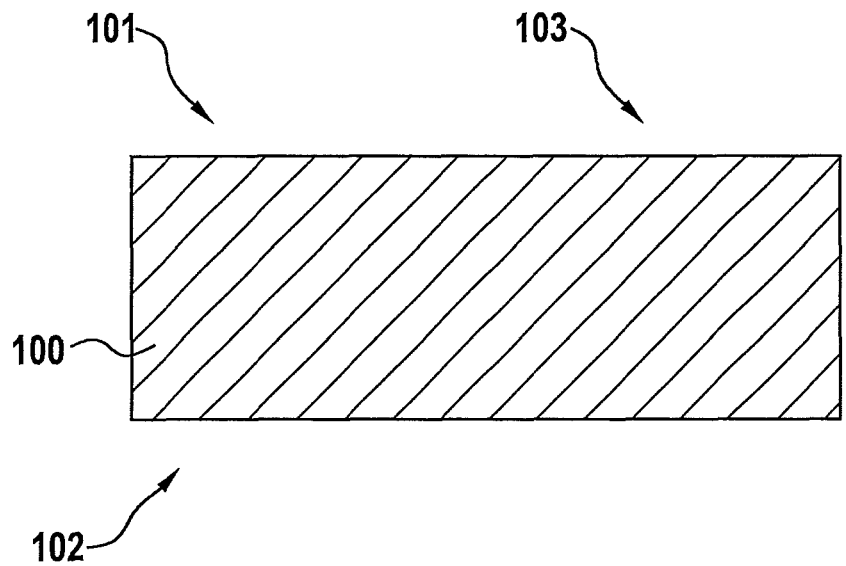
FIG. 1 shows a semiconductor substrate at the start of processing.

The method according to the present invention is explained in greater detail below as an example, with reference to the manufacture of a microelectromechanical component such as a microelectromechanical motion sensor or yaw rate sensor, having at least one microelectromechanical functional structure. At least one through-connection is produced in a semiconductor substrate which is used as a cap wafer for the microelectromechanical functional structure situated on the functional substrate. The starting point is semiconductor substrate 100, for example in the form of a silicon wafer. FIG. 1 shows semiconductor substrate 100, having a front side 101 and a back side 102 opposite from the front side.

Figure 2:
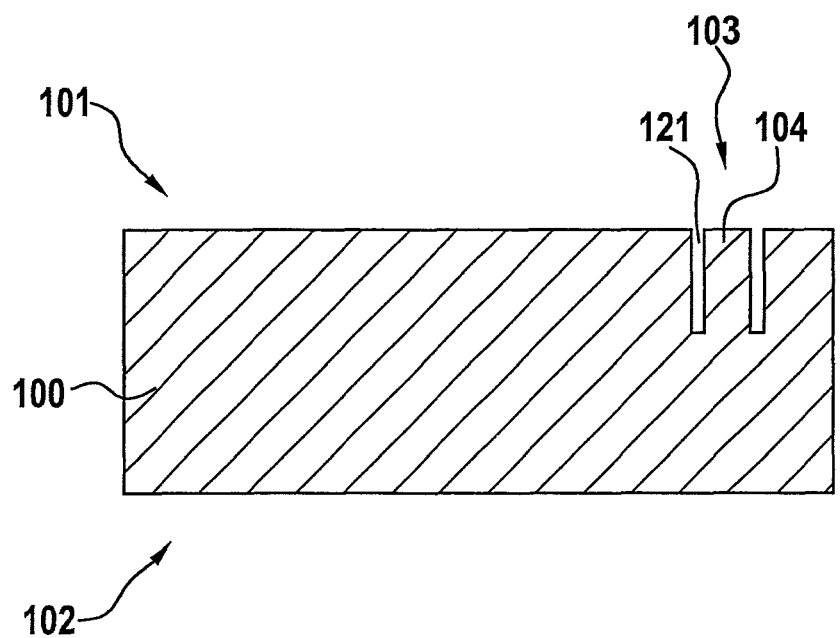
FIG. 2 shows the semiconductor substrate from FIG. 1 with a ring-shaped insulating trench provided on the front side.

An insulating trench 121 which annularly surrounds a contact area 103 is initially produced in semiconductor substrate 100. This is preferably carried out with the aid of a customary trench process, in which a mask layer (TEOS oxide or aluminum, for example) is initially applied and structured with the aid of lithography and an etching process. Insulating trench 121 is subsequently etched with the aid of an anisotropic etching process, such as deep reactive ion etching (DRIE) or with the aid of a trench process, the etching process terminating at a defined depth in the bulk substrate, resulting in a blind hole insulating ring. Alternatively, the insulating trench may also be produced with the aid of a laser-assisted structuring method. FIG. 2 shows insulating trench 121 provided on front side 101 of semiconductor substrate 100 in the form of a blind hole. Alternatively, trench structure 121 may be formed by the entire thickness of semiconductor substrate 100. In this case, the back-side removal of the semiconductor substrate for exposing insulating trench 121 is dispensed with.

Figure 3:
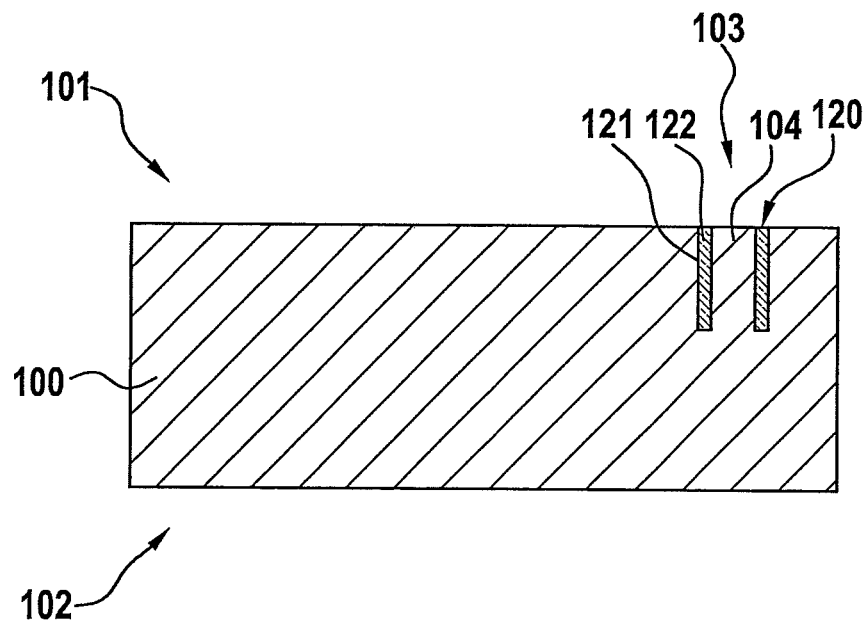
FIG. 3 shows the semiconductor substrate from FIG. 2, with the insulating trench filled with an insulating material.

Insulating trench 121 is now completely filled with an insulating material 122 in a further step. For this purpose, in principle any suitable method and insulating material may be considered. However, insulating trench 121 is preferably filled with a glass, for example a borosilicate glass. This is preferably carried out in an embossing process. FIG. 3 shows semiconductor substrate 100 with insulating structure 120, which is formed by filling insulating trench 121 with a glass 122 as the insulating material.

Figure 4:
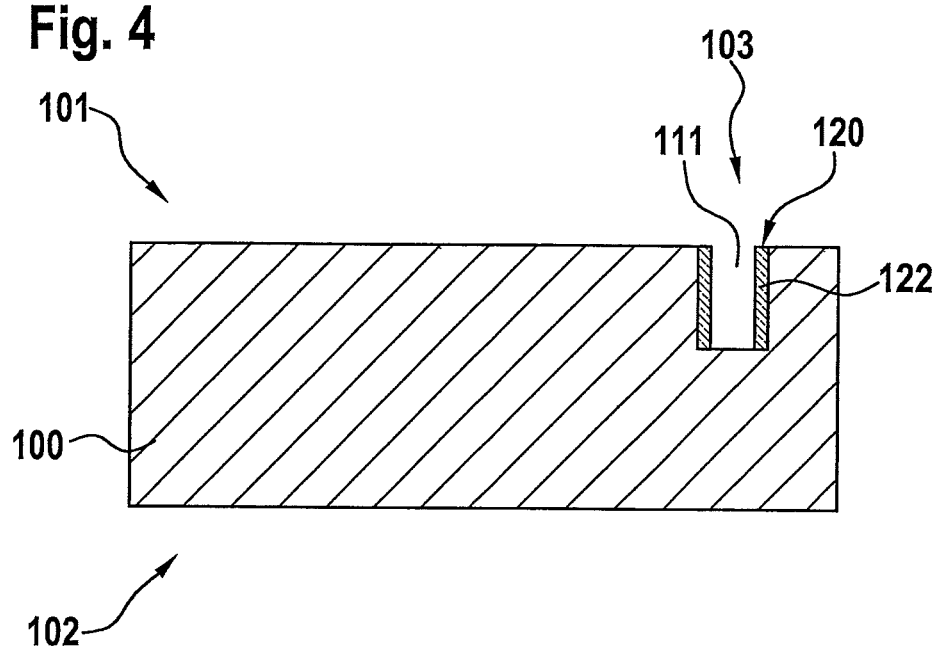
FIG. 4 shows the semiconductor substrate from FIG. 3, with an opened contact hole.

Semiconductor punch 104, which is enclosed by insulating structure 120, is removed using a suitable method in a subsequent method step. For this purpose a mask layer, for example made of TEOS oxide, is preferably reapplied from the outside around the insulating structure, i.e., glass insulating ring 120. Semiconductor punch 104 remaining inside insulating structure 120 is then selectively etched with respect to insulating material 122. In the case of silicon as the semiconductor material, $XeF_2$ and $ClF_3$, for example, may be used as etching gases for this purpose. FIG. 4 shows the corresponding stage of the method after a contact hole 111 has been produced by removing semiconductor material 104 in contact area 103.

The opened contact hole is now filled with a metal in another method step. For completely filling contact hole 111, a galvanic metal plating using copper is preferably used. This process variant allows reliable filling of the contact hole with copper. Alternatively, however, other metal plating processes may also be used. For example, the metal may be coated with a metal such as copper with the aid of a gas phase deposition process (chemical vapor deposition (CVD)). In addition, it is also possible to use an inkjet printing process in which, for example, a nanosilver ink containing an easily expelled organic material as solvent is used for the metal plating. A metal paste printing process is also conceivable in principle.

Figure 5:
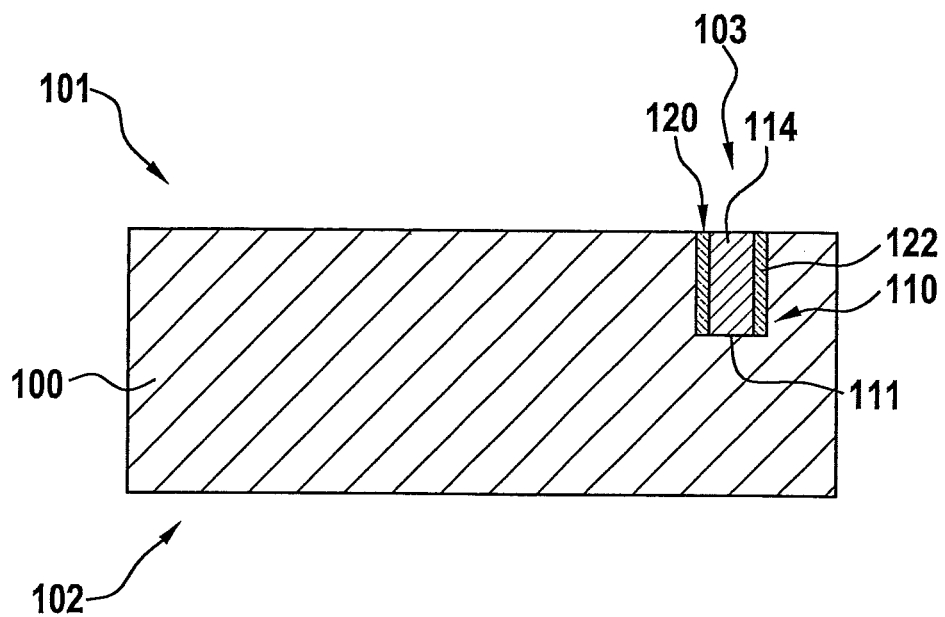
FIG. 5 shows the semiconductor substrate from FIG. 4, with a contact hole completely filled with a metal.

FIG. 5 shows semiconductor substrate 100, with contact hole 111 completely filled with a metal 114.

Figure 6:
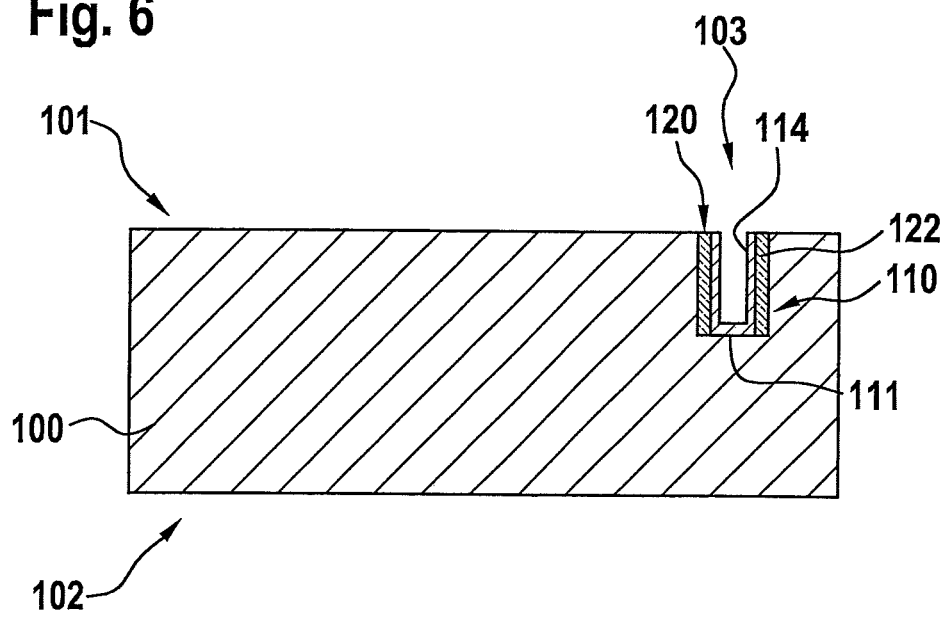
FIG. 6 shows the semiconductor substrate from FIG. 4, with a contact hole which is metal-plated solely with one thin metal layer.

As an alternative to complete filling, the metal plating may be carried out solely by depositing a thin metal layer on the side walls and the base of contact hole 111. The corresponding process variant is shown in FIG. 6. Depending on the application, a thin wetting of the side walls and of the base of contact hole 111 is sufficient.

After electrical through-connection 110 has been completely applied on front side 101 of semiconductor substrate 100, semiconductor substrate 100 is thinned on the back side until insulating structure 120 and metallic filling 114 are exposed. The semiconductor material is preferably removed from back side 102 of semiconductor substrate 100 with the aid of a grinding process. Alternatively, a dry etching process, a wet etching process, or a combination of various processes such as grinding and dry or wet etching may be used for this purpose. FIG. 7 shows a corresponding stage of the method, with through-connection 110 exposed by thinning semiconductor wafer 100 on the back side.

Semiconductor substrate 100 is subsequently connected to a functional substrate 200 within the scope of a bonding method. Semiconductor substrate 100 is intended to be used as a cap wafer for functional substrate 200 or for microelectromechanical functional structures 221 situated on functional substrate 200. For this reason, a cavern 105 for accommodating functional structure 221 is produced in semiconductor substrate 100 by removing semiconductor material with the aid of a suitable method. In the present exemplary embodiment, the cavern is produced on back side 102 of semiconductor substrate 100. Alternatively, however, it is also possible to produce the cavern on front side 101 of semiconductor substrate 100. In addition, at least one contact pad 130 is produced on the metallic through-connection on the side to be bonded, and multiple connecting pads 131, 132 are produced on the surface of semiconductor substrate 100. FIG. 8 shows semiconductor substrate 100 having cavern 105, contact pad 130, and connecting pads 131, 132 immediately prior to the bonding process to functional substrate 200. Functional substrate 200 has a corresponding complementary contact pad 230 and corresponding complementary connecting pads 231, 232. A eutectic system, for example aluminum/germanium, may be used for the bonding. In principle, however, it is possible to use any other conductive system, for example gold/tin.

Figure 9:
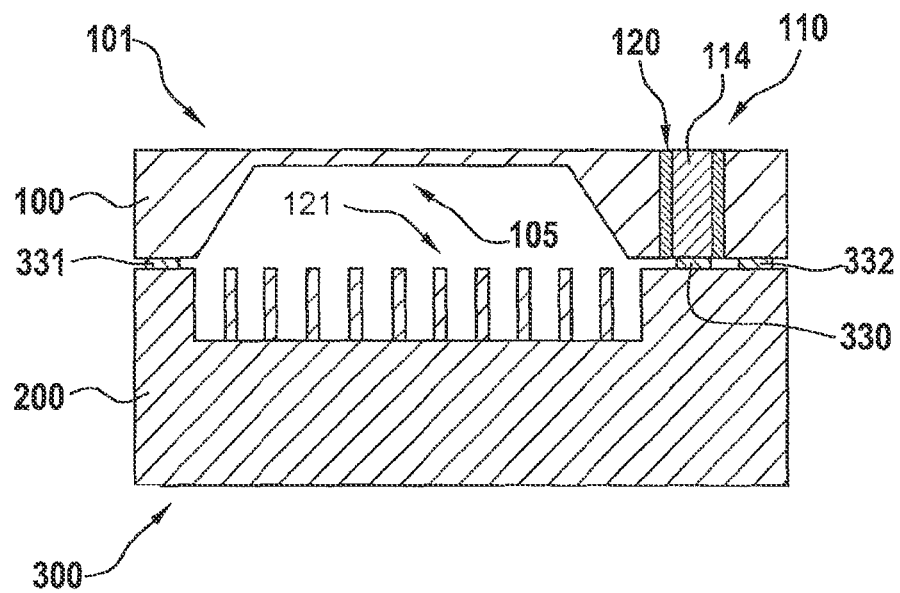
FIG. 9 shows the microelectromechanical component formed by bonding the semiconductor substrate to the functional substrate.

FIG. 9 shows semiconductor substrate 100 bonded to functional substrate 200. Semiconductor substrate 100 forms a cap which covers functional structures 121 of functional substrate 200. At the same time, an electrical connection of functional structures 121 to the outside is achieved via through-connection 120. As a result of the thermal step during the bonding of the two substrates 100, 200, the two contact pads 130, 230 have been fused into a single contact structure 330, and the two connecting pads 131 and 231 as well as the two connecting pads 132 and 232 have been fused into a single connecting structure 331 and 332, respectively.

Figure 10:
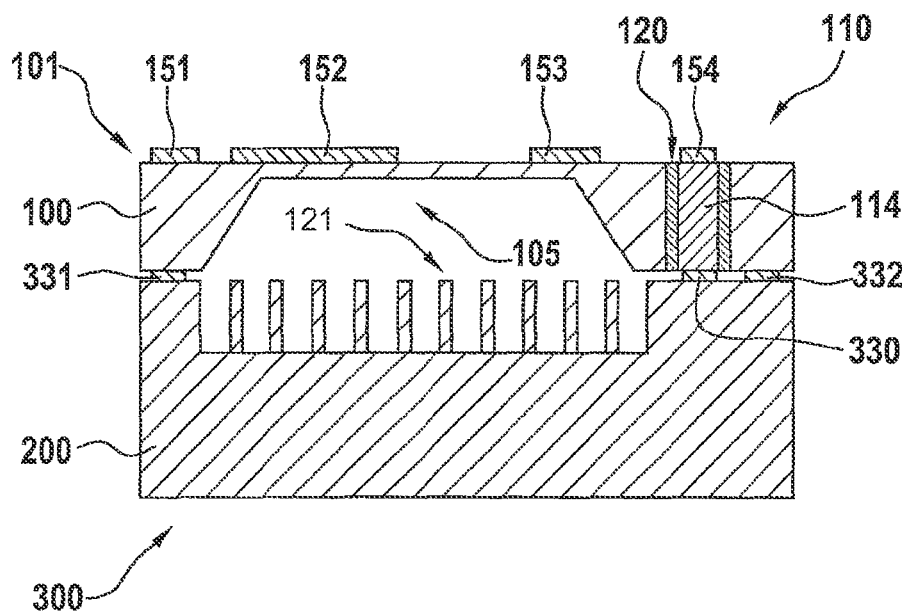
FIG. 10 shows the microelectromechanical component from FIG. 9, with rewiring provided on the front side of the semiconductor substrate.

Lastly, rewiring for metal contact 114 is established on front side 101 of semiconductor substrate 100. This may be carried out, for example, with the aid of structured aluminum printed conductors. Imprinting of printed conductors with the aid of a screen printing process is also possible. In this regard, for example, a conductive paste composed of silver or gold may be used. FIG. 10 shows component 300 designed as a bonded substrate stack, having rewiring structures 151, 152, 153, 154 formed on front side 101 of the semiconductor substrate.

Figure 11:
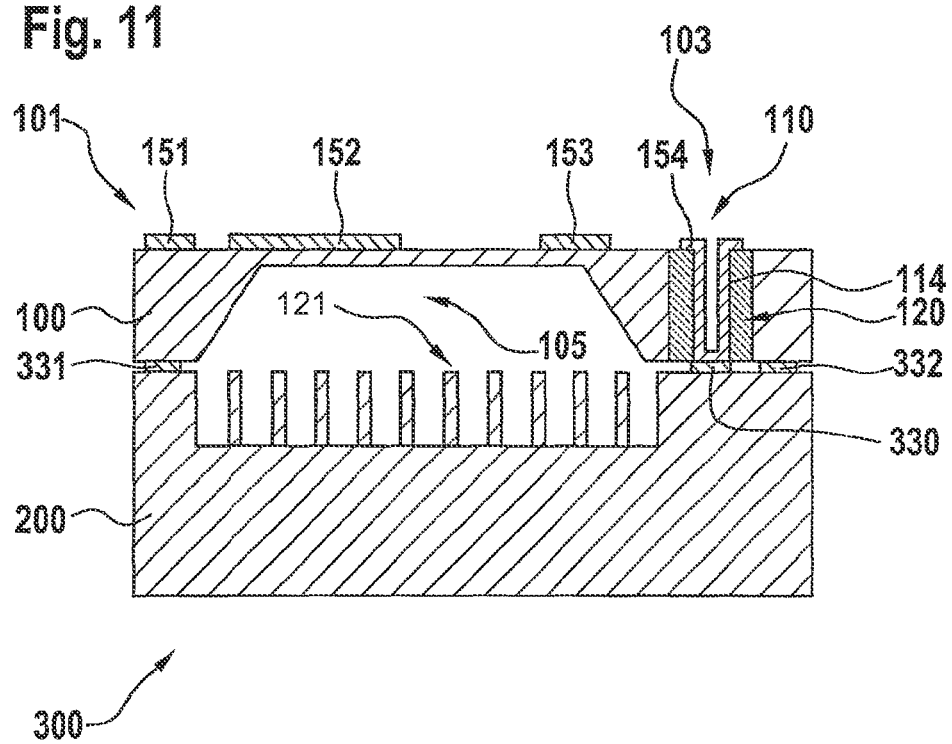
FIG. 11 shows an alternative specific embodiment of the microelectromechanical component, with metal plating of the contact hole implemented solely by one thin metal layer.

FIG. 11 shows an alternative embodiment of component 300, having a through-connection 110 in which metal plating 114 has been implemented solely as a thin metal layer.

As an alternative to the process variant shown in FIGS. 7 through 10, the thinning of semiconductor wafer 110 may also be carried out only after the bonding process.

Figure 12:
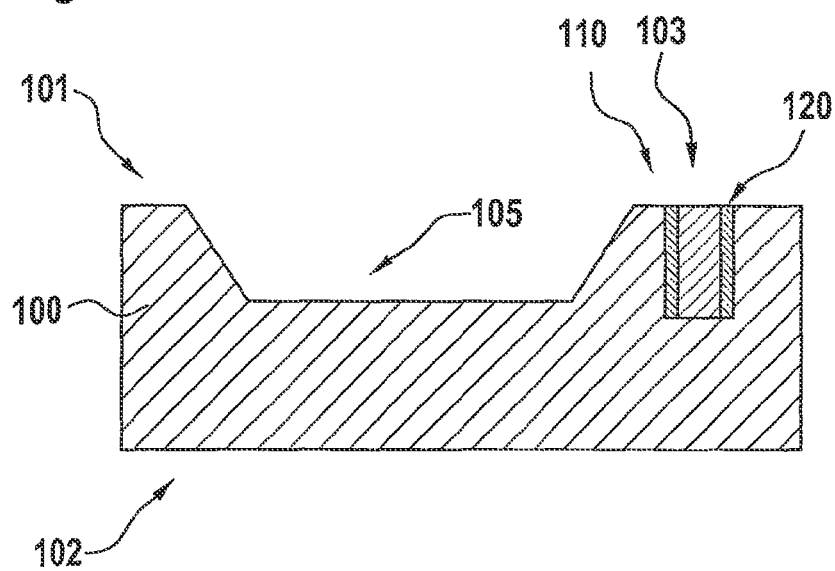
FIG. 12 show an alternative variant in which the cavern is produced on the front side of the semiconductor substrate.

FIG. 12 shows semiconductor substrate 100 with a cavern 105 situated on front side 101.

Figure 13:
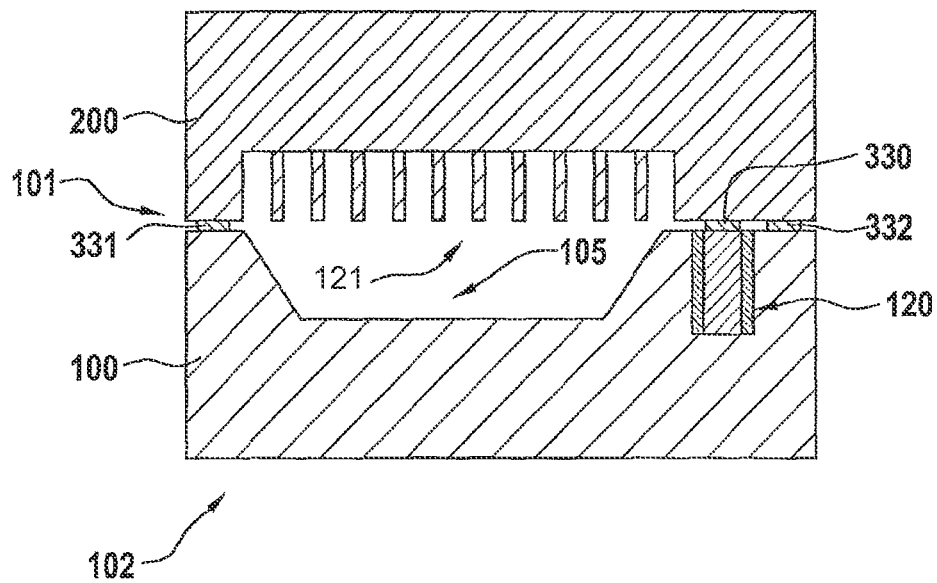
FIG. 13 shows the semiconductor substrate from FIG. 12 after the bonding to the functional substrate.

Semiconductor substrate 100 is then connected at its front side 101 to functional substrate 200. This stage of the method is shown in FIG. 13.

Figure 14:
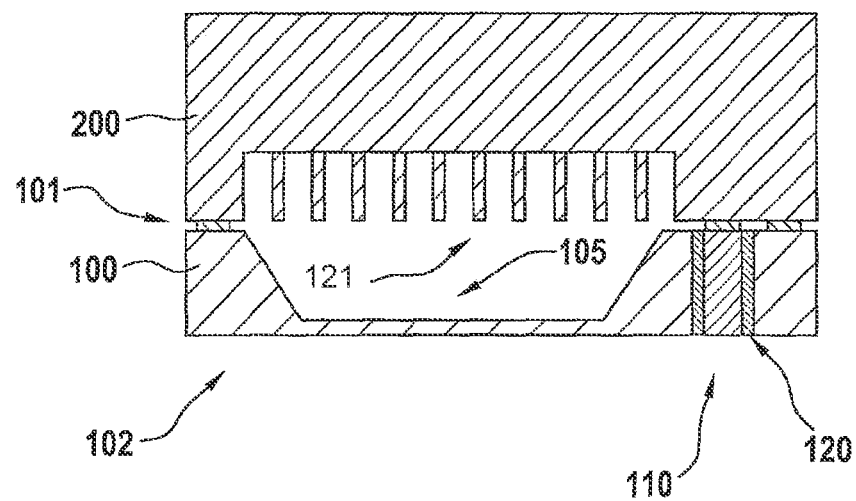
FIG. 14 shows the bonded semiconductor substrate from FIG. 9 after thinning, the semiconductor material having been removed on the back side of the semiconductor substrate until the through-connection is exposed.

The semiconductor substrate is then thinned on the back side, through-connection 110 being completely exposed. This stage of the method is shown in FIG. 14.

Figure 15:
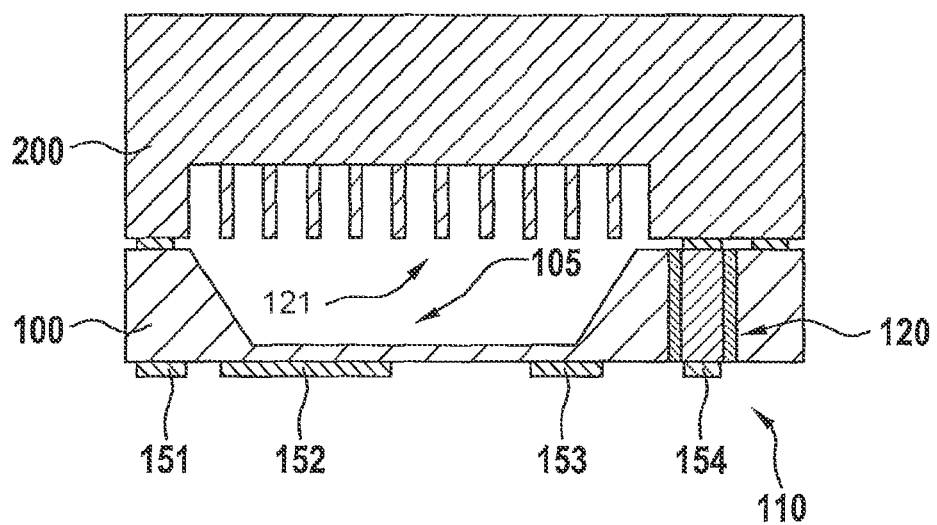
FIG. 15 shows the microelectromechanical component from FIG. 14, with rewiring provided on the front side of the semiconductor substrate.

Lastly, rewiring structures 151, 152, 153, 154 are established on back side 102 of semiconductor substrate 100. This stage of the method is shown in FIG. 15.

Although the present invention has been illustrated and described in greater detail by the preferred exemplary embodiments, the present invention is not limited by the disclosed examples. Rather, other variations may also be derived therefrom by those skilled in the art without departing from the scope of protection of the present invention. In particular, any other suitable materials may be used in addition to the substrate materials, metal plating materials, and insulating materials mentioned herein. In principle, any meaningful combination of the various materials may also be considered for this purpose.

Furthermore, in principle the through-connection produced here may also be used for microelectronic components in addition to microelectromechanical components.

In principle, it is possible to subsequently produce the microelectromechanical component with the aid of a so-called wafer-on-wafer process in which wafers are bonded to one another, and the bonded wafers are subsequently separated with the aid of a so-called die-on-wafer process in which individual dies are bonded to a wafer and the wafer is subsequently separated, or with the aid of a so-called die-on-die process in which already separated dies are bonded to one another.

In addition, it is possible in principle to establish the rewiring or at least a portion of the rewiring within the scope of the metal plating of the contact hole.

What is claimed is:

1. A method for manufacturing a component having an electrical through-connection, the method comprising:
   providing a semiconductor substrate having a front side and a back side opposite from the front side;
   producing, on the front side of the semiconductor substrate, an insulating trench configured as a blind hold, the insulating trench annularly surrounding a contact area;
   introducing an insulating material into the insulating trench;
   producing a contact hole on the front side of the semiconductor substrate by removing a portion of the semiconductor substrate in the contact area surrounded by the insulating trench;
   depositing a metallic material in the contact hole; and
   after the metallic material is deposited in the contact hole, thinning the semiconductor substrate from the back side to expose the insulating material and the metallic material,
   wherein the metallic material deposited in the contact hole extends only from a bottom of the contact hole to a top of the contact hole that is level with the front side of the semiconductor substrate.

2. The method as recited in claim 1, wherein the semiconductor material remaining in the contact area is selectively removed with respect to the insulating material in the insulating trench with the aid of an isotropic etching process.

3. The method as recited in claim 1, wherein the thinning of the semiconductor substrate is carried out with the aid of one of (i) a grinding process, (ii) a wet etching process, (iii) a dry etching process, (iv) a combination of a grinding process and a wet etching process, or (v) a combination of a grinding process and a dry etching process.

4. The method as recited in claim 1, wherein at least one of an electroplating copper deposition process, a copper CVD process, a metal paste printing process, and an inkjet printing process using nanosilver ink is used for filling the contact hole with the metallic material.

5. A method for manufacturing a component having an electrical through-connection, the method comprising:
   providing a semiconductor substrate having a front side and a back side opposite from the front side;
   producing, on the front side of the semiconductor substrate, an insulating trench configured as a blind hold, the insulating trench annularly surrounding a contact area;
   introducing an insulating material into the insulating trench;
   producing a contact hole on the front side of the semiconductor substrate by removing a portion of the semiconductor substrate in the contact area surrounded by the insulating trench;
   depositing a metallic material in the contact hole; and
   after the metallic material is deposited in the contact hole, thinning the semiconductor substrate from the back side to expose the insulating material and the metallic material,
   wherein borosilicate glass is introduced as the insulating material into the insulating trench with the aid of an embossing process.

6. A method for manufacturing a component having an electrical through-connection, the method comprising:
   providing a semiconductor substrate having a front side and a back side opposite from the front side;
   producing, on the front side of the semiconductor substrate, an insulating trench configured as a blind hold, the insulating trench annularly surrounding a contact area;
   introducing an insulating material into the insulating trench;
   producing a contact hole on the front side of the semiconductor substrate by removing a portion of the semiconductor substrate in the contact area surrounded by the insulating trench;
   depositing a metallic material in the contact hole; and
   after the metallic material is deposited in the contact hole, thinning the semiconductor substrate from the back side to expose the insulating material and the metallic material,
   wherein the deposition of the metallic material in the contact hole is carried out together with establishing rewiring on the front side of the semiconductor substrate.

7. A method for manufacturing a component having an electrical through-connection, the method comprising:
   providing a semiconductor substrate having a front side and a back side opposite from the front side;
   producing, on the front side of the semiconductor substrate, an insulating trench configured as a blind hold, the insulating trench annularly surrounding a contact area;
   introducing an insulating material into the insulating trench;
   producing a contact hole on the front side of the semiconductor substrate by removing a portion of the semiconductor substrate in the contact area surrounded by the insulating trench;
   depositing a metallic material in the contact hole; and
   after the metallic material is deposited in the contact hole, thinning the semiconductor substrate from the back side to expose the insulating material and the metallic material,
   wherein after the metallic material is deposited in the contact hole, the semiconductor substrate is connected to a functional substrate within the scope of a bonding process.

8. The method as recited in claim 7, wherein a cavern for accommodating a functional structure situated on the functional substrate is produced before the semiconductor substrate is connected to the functional substrate on the front side of the semiconductor substrate.

9. A component, comprising:
   a semiconductor substrate having an electrical through connection which passes through the semiconductor substrate from a front side to a back side opposite from the front side;

wherein the through-connection includes an insulating structure having:
an insulating trench which annularly surrounds a contact area and which is filled with an insulating material; an electrical contact structure situated on the back side of the semiconductor substrate in the contact area, and a metallic filling situated in the contact area and delimited by the insulating structure, the metallic filling electrically connecting the electrical contact structure to the front side of the semiconductor substrate, wherein the semiconductor substrate has a cavern and is connected to a functional substrate in such a way that a functional structure situated on the surface of the functional substrate is present inside the cavern.

10. The component as recited in claim 9, wherein the insulating trench has a borosilicate glass as the insulating material.

11. The component as recited in claim 9, wherein the semiconductor substrate has a cavern and is connected to a functional substrate in such a way that a functional structure situated on a surface of the functional substrate is present inside the cavern.

12. The component as recited in claim 11, wherein the insulating trench has a borosilicate glass as the insulating material.

13. The component as recited in claim 11, wherein the cavern is produced on the front side of the semiconductor substrate.

14. The component as recited in claim 11, wherein the cavern is produced on the back side of the semiconductor substrate.

15. The method as recited in claim 13, wherein the metallic filling in the contact area electrically connects the electrical contact structure to the back side of the semiconductor substrate and wherein rewiring is established on the back side of the semiconductor substrate.

* * * * *